(12) United States Patent
Liu et al.

(10) Patent No.: US 12,724,077 B2
(45) Date of Patent: Sep. 1, 2026

(54) STATE OF CHARGE CALIBRATION FOR BATTERY CELLS

(71) Applicant: GM GLOBAL TECHNOLOGY OPERATIONS LLC, Detroit, MI (US)

(72) Inventors: Jingyuan Liu, Shanghai (CN); Dewen Kong, Shanghai (CN); Si Chen, Shanghai (CN); Meiyuan Wu, Shanghai (CN); Haijing Liu, Shanghai (CN)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 205 days.

(21) Appl. No.: 18/639,317

(22) Filed: Apr. 18, 2024

(65) Prior Publication Data

US 2025/0314702 A1 Oct. 9, 2025

(30) Foreign Application Priority Data

Apr. 9, 2024 (CN) ........................ 202410423826.2

(51) Int. Cl.

*G01R 31/382* (2019.01)
*G01B 21/08* (2006.01)
*G01R 35/00* (2006.01)
*H01M 10/42* (2006.01)
*H01M 10/48* (2006.01)

(52) U.S. Cl.

CPC ........... *G01R 31/382* (2019.01); *G01B 21/08* (2013.01); *G01R 35/005* (2013.01); *H01M 10/4264* (2013.01); *H01M 10/482* (2013.01); *H01M 2010/4271* (2013.01)

(58) Field of Classification Search

CPC .. G01R 31/382; G01R 35/005; G01R 31/387; G01B 21/08; H01M 10/4264; H01M 10/482; H01M 2010/4271; H01M 2220/20; H01M 10/425; H01M 10/48; Y02E 60/10

USPC .......................................................... 324/426

See application file for complete search history.

(56) References Cited

U.S. PATENT DOCUMENTS

2014/0333312 A1* 11/2014 Schlag ................ G01R 31/382 324/426
2023/0324462 A1* 10/2023 Lundqvist ........... G01R 31/387 320/132

FOREIGN PATENT DOCUMENTS

DE 102014103800 A1 11/2014
JP 2023152252 A * 10/2023

* cited by examiner

*Primary Examiner* — Arleen M Vazquez
*Assistant Examiner* — Robert P Alejnikov, Jr.

(57) ABSTRACT

A battery system includes a pressure sensor configured to sense pressure changes corresponding to thickness changes of at least one of a plurality of battery cells of a battery. A battery management module includes a state of charge (SOC) estimator configured to estimate the SOC of the battery. Based on sensed pressure, the SOC estimator detects at least one of a first inflection point and a second inflection point during one of charging and discharging of the battery, and calibrates the SOC of the battery based on at least one of a first SOC value and a second SOC value corresponding to the at least one of the first inflection point and the second inflection point, respectively.

20 Claims, 4 Drawing Sheets

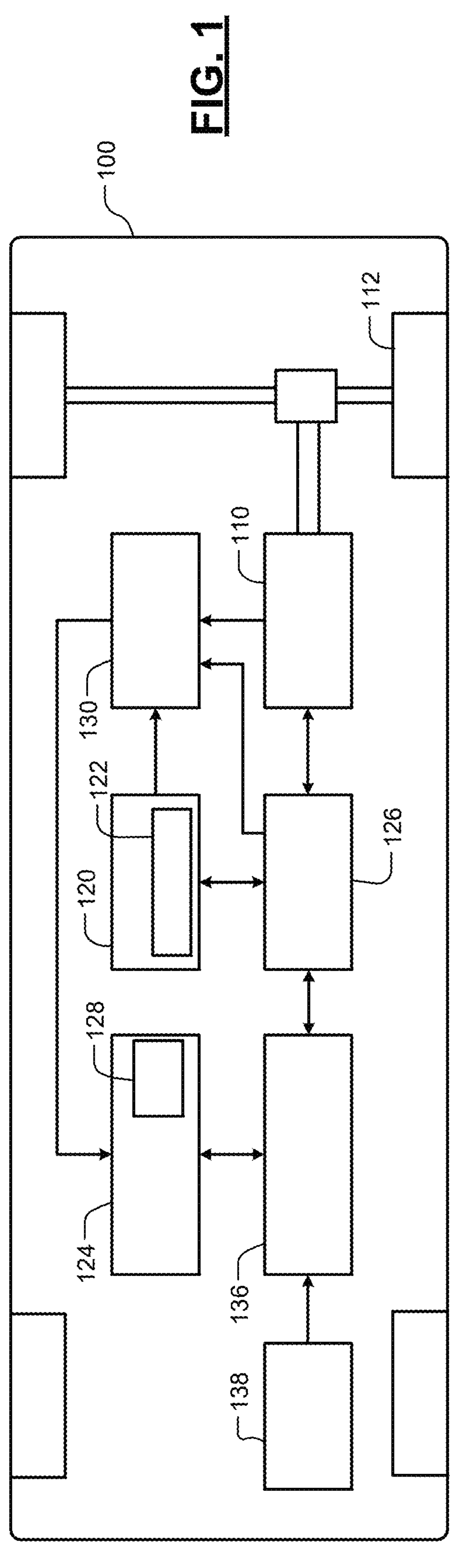
FIG. 1
100
112
110
130
122
120
126
128
124
136
138
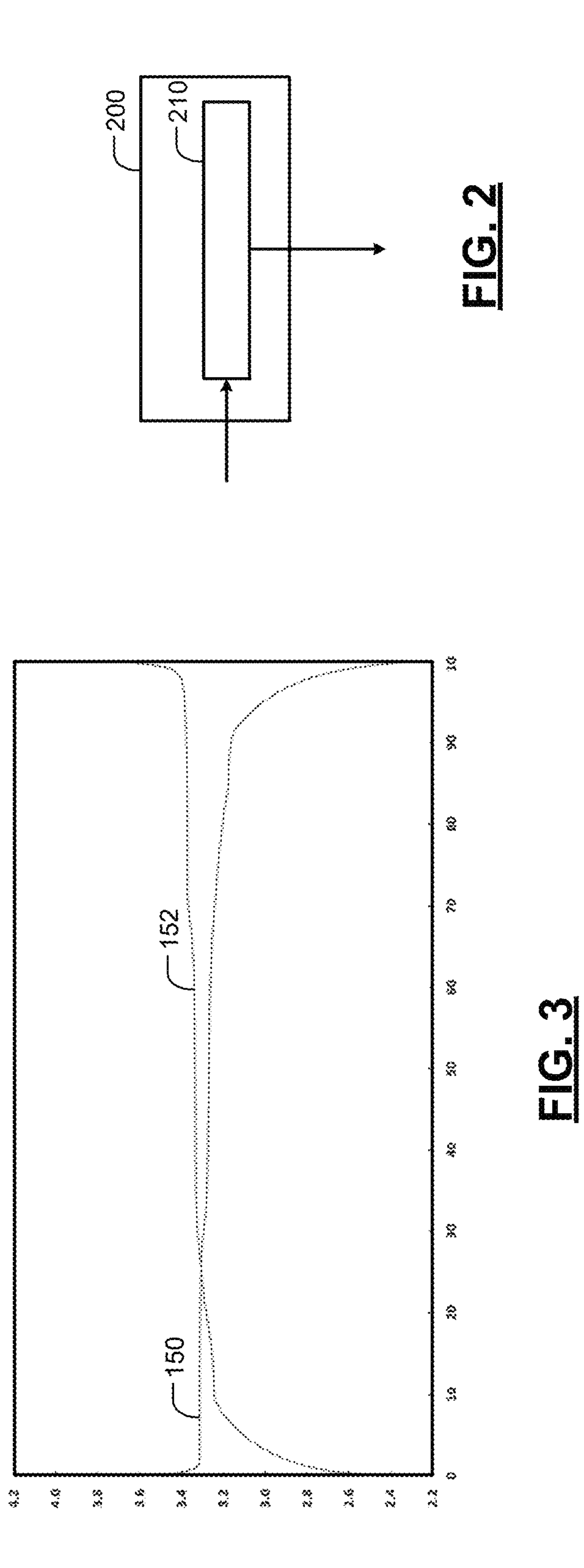
200
210
FIG. 2
152
150
FIG. 3

STATE OF CHARGE CALIBRATION FOR BATTERY CELLS

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to battery systems, and more particularly to calibration of state of charge estimates for battery systems.

Electric vehicles (EVs) such as battery electric vehicles (BEVs), hybrid vehicles, and/or fuel cell vehicles include one or more electric machines and a battery system including one or more battery cells, modules, and/or packs. A power control system is used to control charging and/or discharging of the battery system during charging and/or driving. A battery management system monitors various battery parameters and estimates a state of charge (SOC) of the battery system.

SUMMARY

A battery system includes a pressure sensor configured to sense pressure changes corresponding to thickness changes of at least one of a plurality of battery cells of a battery. A battery management module includes a state of charge (SOC) estimator configured to estimate the SOC of the battery. Based on sensed pressure, the SOC estimator detects at least one of a first inflection point and a second inflection point during one of charging and discharging of the battery, and calibrates the SOC of the battery based on at least one of a first SOC value and a second SOC value corresponding to the at least one of the first inflection point and the second inflection point, respectively.

In other features, the battery system includes the battery including the plurality of battery cells. The plurality of battery cells include cathode electrodes including LFP cathode active material.

In other features, the battery includes the plurality of battery cells. The plurality of battery cells include anode electrodes including graphite anode active material.

In other features, the battery includes the plurality of battery cells. The plurality of battery cells of the battery comprise capacitor assisted battery (CAB) cells.

In other features, the pressure sensor is arranged between at least two adjacent ones of the plurality of battery cells. The pressure sensor comprises a 2D pressure sensor.

In other features, the SOC estimator does not calibrate the SOC in response to inflection points within a predetermined period of a polarity change in current. The battery management module is configured to calculate capacity retention and to adjust the at least one of the first SOC value and the second SOC value based on the capacity retention. The SOC estimator is configured to calibrate the SOC of the battery based on the first SOC value and the second SOC value.

In other features, the SOC estimator is configured to, based on sensed pressure, detect a third inflection point and a fourth inflection point during the other of charging and discharging of the battery and calibrate the SOC of the battery based on a third SOC value and a fourth SOC value corresponding to the third inflection point and the fourth inflection point, respectively.

A method for estimating state of charge (SOC) of a battery system includes sensing pressure changes corresponding to thickness changes of at least one of a plurality of battery cells; estimating the SOC of a battery; based on sensed pressure, detecting at least one of a first inflection point and a second inflection point during one of charging and discharging of the battery; and calibrating the SOC of the battery based on at least one of a first SOC value and a second SOC value corresponding to the at least one of the first inflection point and the second inflection point, respectively.

In other features, the plurality of battery cells include cathode electrodes including LFP cathode active material. The plurality of battery cells include anode electrodes including graphite anode active material. The plurality of battery cells of the battery comprise capacitor assisted battery (CAB) cells.

In other features, the method includes arranging a pressure sensor between at least two adjacent ones of the plurality of battery cells. The pressure sensor comprises a 2D pressure sensor. The method includes not calibrating the SOC in response to inflection points within a predetermined period of a polarity change in current. The method includes calculating capacity retention and adjusting the at least one of the first SOC value and the second SOC value based on the capacity retention.

In other features, the method includes calibrating the SOC of the battery based on the first SOC value and the second SOC value.

In other features, based on sensed pressure, the method includes detecting a third inflection point and a fourth inflection point during the other of charging and discharging of the battery; and calibrating the SOC of the battery based on a third SOC value and a fourth SOC value corresponding to the third inflection point and the fourth inflection point, respectively.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein:

FIG. 1 is a functional block diagram of an example of a vehicle including a battery system according to the present disclosure;

FIG. 2 is a functional block diagram of an example of a state of charge estimator;

FIG. 3 is a graph illustrating an example of voltage as a function of state of charge for a battery cell including cathode electrodes using lithium iron phosphate (LFP) and anode electrodes using graphite;

In the drawings, reference numbers may be reused to identify similar and/or identical elements.

DETAILED DESCRIPTION

Figure 4:
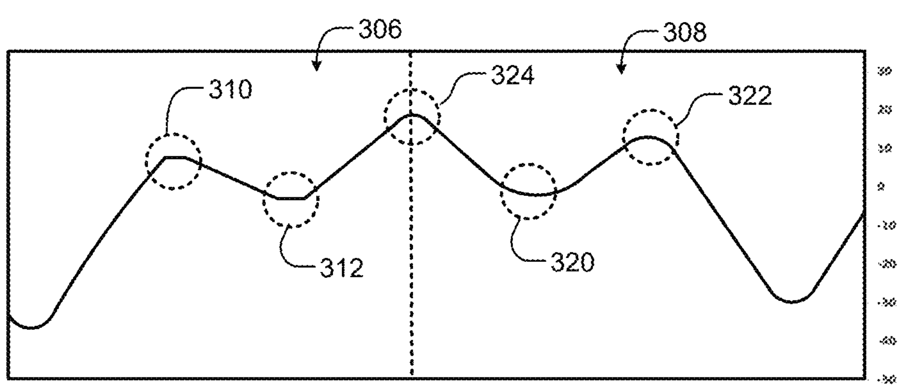
FIG. 4 is a graph illustrating an example of thickness change as a function of time during charging and discharging.

While the systems and methods for calibrating state of charge (SOC) are described below in the context of electric and hybrid vehicles, the systems and methods can be used to calibrate SOC for battery systems in other applications.

It is difficult to estimate state of charge (SOC) for battery cells including lithium iron phosphate (LFP) as the cathode active material and graphite as the anode active material. LFP/graphite based battery cells have an extremely flat voltage profile which makes it difficult to estimate SOC based on changes in voltage. Currently, LFP/graphite based battery cells estimate SOC using a coulombic counter that tracks current usage over time.

However, the coulombic counter has an accumulated error and needs periodic re-calibration. The current method for calibrating the SOC estimate for LFP-based battery cells involves slowly charging the LFP-based cell from a low SOC to check capacity. This calibration method requires a significant amount of time. In addition, The vehicle may not have a low SOC often enough to effectively calibrate the SOC estimates.

During charging, the thickness of the LFP-based battery cells increase, decrease, and then increase (corresponding to two charge inflection points). During discharge, the thickness of the battery cells decrease, increase, and then decrease (corresponding to two discharge inflection points). The SOCs at the inflection points are not impacted by current charge (C) rate and/or other dynamic inputs (but will change slowly over time in response to reducing capacity retention).

SOC estimating systems and methods according to the present disclosure are calibrated by detecting the inflection points corresponding to changes in thickness during charging and discharging. The inflection points correspond to known SOC values. When the inflection points occur, the known SOC values are used to calibrate or correct the SOC values calculated by the SOC estimator. The SOC calibration method is more accurate and faster than prior calibration methods.

Referring now to FIG. 1, a vehicle 100 includes an electric motor 110 that drives one or more wheels 112 of the vehicle 100. A battery 120 provides propulsion power to and/or receives regeneration power from the electric motor 110 via a power inverter 126. In some examples, the battery 120 includes LFP/graphite battery cells. In some examples, the battery 120 includes capacitor assisted LFP/graphite battery cells. In some examples, the battery 120 includes pouch or prismatic battery cells.

While a battery electric vehicle is shown, the vehicle 100 can be a hybrid vehicle including an internal combustion engine (ICE).

A propulsion controller 136 receives throttle position from an accelerator pedal 138 (or an autonomous driving system or cruise control). A battery management module 124 receives sensed parameters from sensors 130 and estimates the SOC of the battery 120. The propulsion controller 136 controls the power inverter 126 based on the SOC of the battery 120, the throttle position (or other propulsion request), and the sensed parameters. The battery management module 124 includes a state of charge (SOC) estimator 128 configured to estimate the SOC of the battery 120. As will be described further below, the battery 120 includes a plurality of battery cells and one or more pressure sensors 122 arranged between the battery cells. The pressure sensors 122 are used to monitor thickness changes of the battery cells to identify thickness inflection points corresponding to know SOC values.

Referring now FIG. 2, the SOC estimator 128 estimates SOC using any suitable SOC estimation method. For example, an SOC estimator 200 includes a coulombic counter 210 that receives and accumulates current output to the power inverter 126 (or received from the power inverter 126). The SOC estimator 200 estimates the SOC of the battery system based on current consumed (and/or recovered through regeneration) since the last charging cycle. For example, the coulombic counter 210 can calculate $SOC_i=1*\Delta t/Q_0+SOC_{i-1}$. Due to current measurement errors, $I*\Delta t$ is not always accurate. As a result, the errors can accumulate and cause the estimated SOC to drift from the actual value. If the vehicle is not driven for a long period of time, the battery management system does not know the amount of self-discharge that occurred while parked and the SOC estimate requires recalibration for accuracy.

Referring now to FIG. 3, voltage is shown as a function of state of charge for a battery including cathode electrodes using lithium iron phosphate (LFP) as the cathode active material and anode electrodes using graphite as the anode active material. The slope of the voltage is relatively low (e.g., positive for charging and negative for discharging) between low SOC and high SOC values, which makes SOC estimation based on voltage difficult.

Referring now to FIG. 4, thickness changes are shown as a function of time during charging and discharging for a battery cell including LFP/graphite. During charging at 306, the thickness increases, then decreases (creating a first inflection point 310), and then increases (creating a second inflection point 312). During discharging at 308, the thickness decreases, then increases (creating a first inflection point 320), and then decreases (creating a second inflection point 322). In other words, there are two inflection points during both charging and discharging. Transitions between charging and discharging (where current polarity changes) at 324 are not used.

Figure 5:
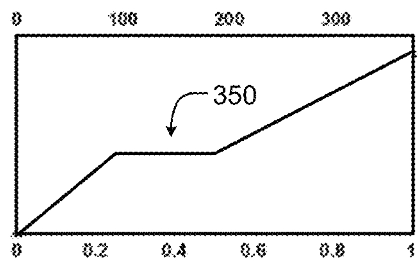
FIG. 5 is a graph illustrating an example of a swelling curve (thickness as a function of state of charge and capacity) for an anode electrode using graphite active material.
Figure 6:
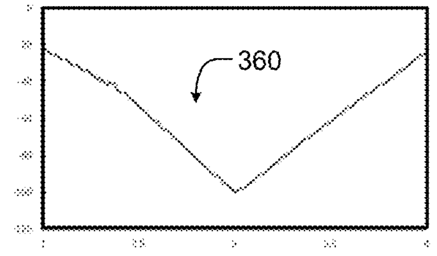
FIG. 6 is a graph illustrating an example of a swelling curve (thickness as a function of voltage) for a cathode electrode using LFP active material.

Referring now to FIGS. 5 and 6, the anode and cathode electrodes swell and shrink during charging and discharging, respectively. In FIG. 5, an example of a swelling curve (fractional volume as a function of state of charge and capacity) is shown for an anode electrode using graphite active material during charging. In FIG. 6, an example of a swelling curve (change in thickness as a function of voltage) for a cathode electrode using LFP active material is shown. As can be seen, the thickness inflection points during charging and discharging are related to the swelling/shrinking of the graphite anode active material.

Figure 7:
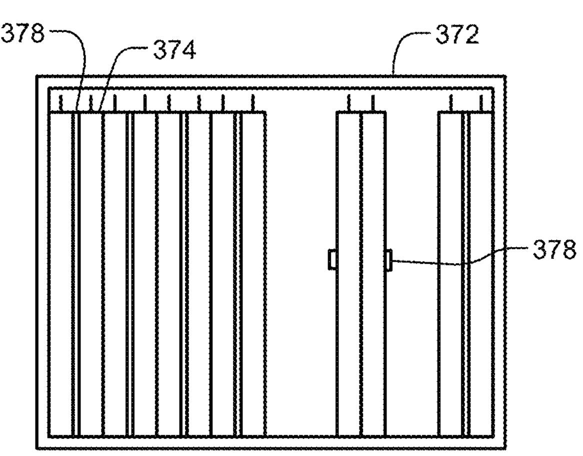
FIG. 7 is a side cross section of an example of a battery module including battery cells with a pressure sensor arranged between the battery cells according to the present disclosure.

Referring now to FIG. 7, an example of a battery module 372 including a plurality of battery cells 374 is shown. One or more pressure sensors 378 arranged between adjacent ones of the plurality of battery cells 374. The pressure sensors 378 can include a pressure sensor that senses pressure at a point location and/or a 2D pressure sensor that senses pressure across a two dimensional (2D) area. In some examples, the pressure sensors 378 can be arranged inside or outside of the enclosure of the battery cells. In some examples, the pressure sensors 378 are arranged between enclosures of one or more adjacent pairs of the battery cells.

Figure 8:
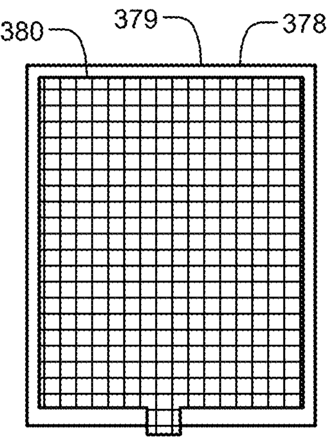
FIG. 8 is a plan view of an example of a 2D pressure sensor according to the present disclosure.

Referring now to FIG. 8, an example of the pressure sensor 378 acting as a 2D pressure sensor is shown. The pressure sensor 378 includes a substrate 379 (such as an insulating film) and a pattern of conductive traces 380.

Figure 9:
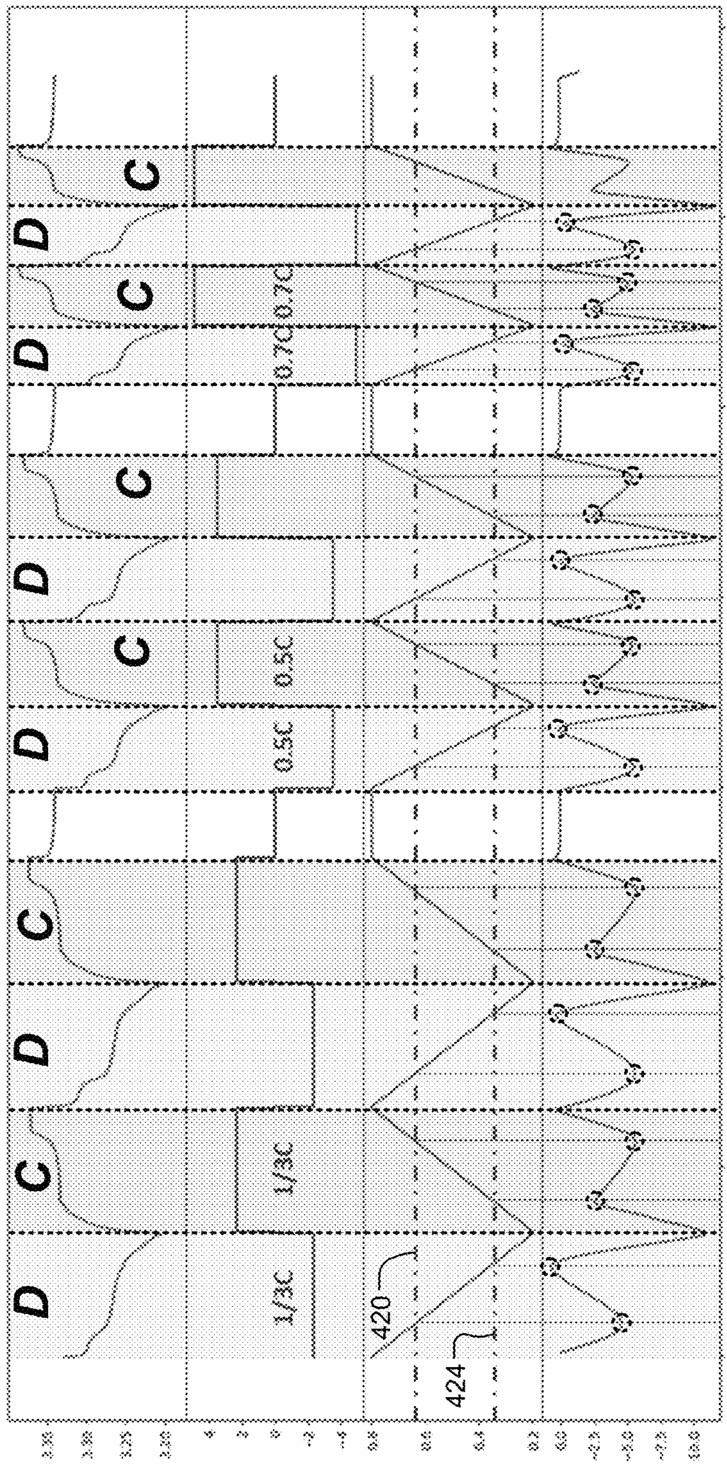
FIG. 9 is a graph illustrating an example of voltage, current, SOC, and thickness during charging and discharging according to the present disclosure.

Referring now to FIG. 9, an example of voltage, current, SOC, and thickness are shown during charging and discharging. As can be seen, the thickness inflection points during charging and discharging correspond to predetermined SOC values at 420 and 424. The battery management module determines when the inflection points occur and calibrates the SOC estimate using the predetermined SOC values at the thickness inflection points.

Figures 10, 11:
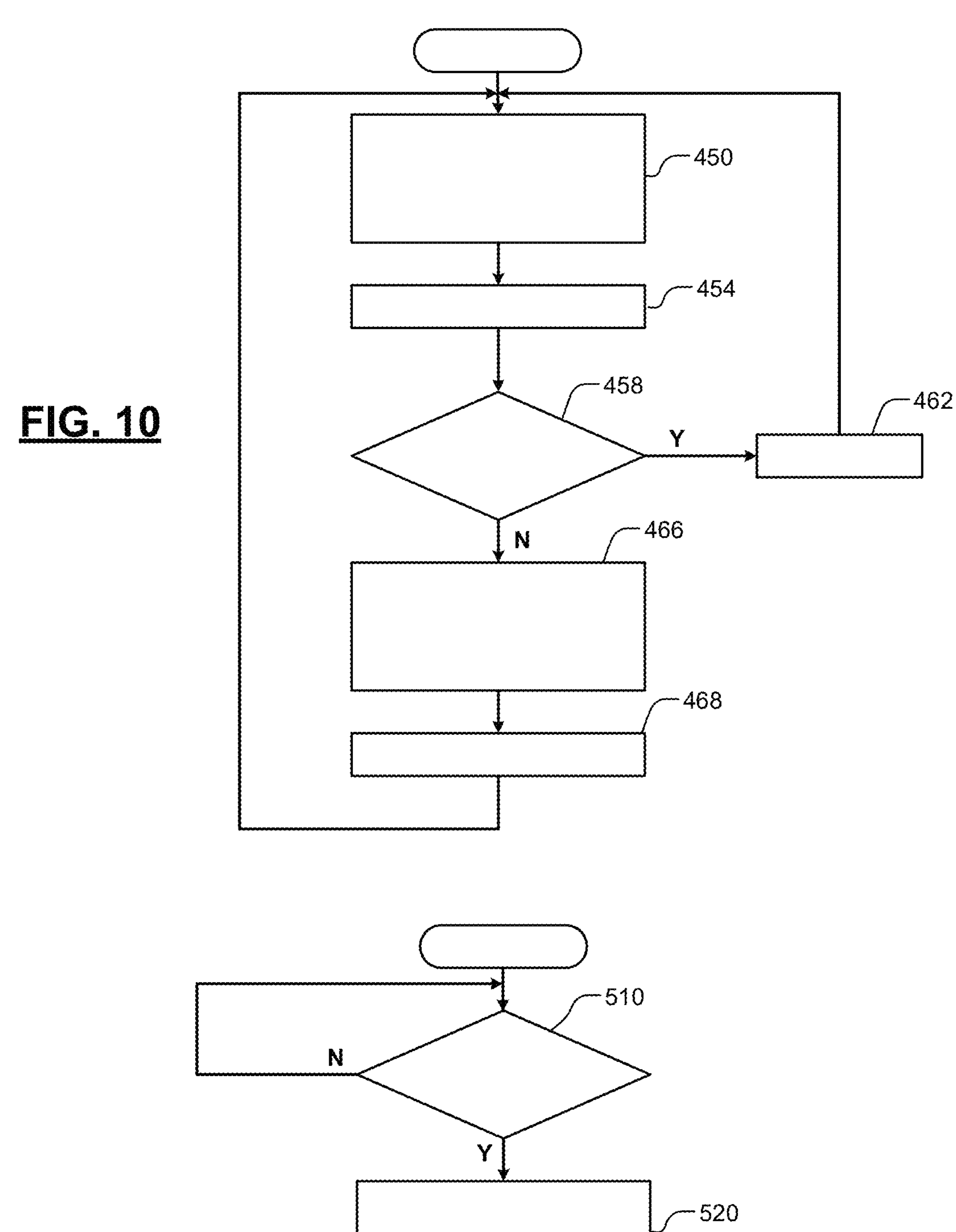
FIG. 10 is a flowchart of an example of a method for calibrating SOC according to the present disclosure.
FIG. 11 is a flowchart of a method for adjusting the SOC values at the inflection points based on changes in capacity retention according to the present disclosure.

Referring now to FIG. 10, a method for calibrating the SOC estimate is shown. At 450, the pressure data is measured for one or more battery cells during cycling. At 454, the thickness inflection points are identified in the pressure data. At 458, the method determines whether current reversed (change in polarity) at the same time as or within a predetermined period of the inflection point. If 458 is true, the inflection point is not used at 462 since it corresponds to a transition between charging and discharging (or vice versa). If 458 is false, the SOC estimate is calibrated based on an SOC value from an inflection point table at 466. At 468, the calibrated SOC estimate is output to other vehicle systems.

Referring now to FIG. 11, a method for adjusting the SOC values at the inflection points based on changes in capacity retention is shown. At 510, the method determines whether the SOC values at the inflection points need to be updated. In some examples, the updates are performed in response to an event such as expiration of a predetermined period, a predetermined number of cycles, at key on, and/or any other event. When 510 is true, the method continues with 520 and calculates capacity retention a. At 530, the SOC values for the inflection points are updated by SOC'=SOC/a.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include: an Application Specific Integrated Circuit (ASIC); a digital, analog, or mixed analog/digital discrete circuit; a digital, analog, or mixed analog/digital integrated circuit; a combinational logic circuit; a field programmable gate array (FPGA); a processor circuit (shared, dedicated, or group) that executes code; a memory circuit (shared, dedicated, or group) that stores code executed by the processor circuit; other suitable hardware components that provide the described functionality; or a combination of some or all of the above, such as in a system-on-chip.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. The term shared processor circuit encompasses a single processor circuit that executes some or all code from multiple modules. The term group processor circuit encompasses a processor circuit that, in combination with additional processor circuits, executes some or all code from one or more modules. References to multiple processor circuits encompass multiple processor circuits on discrete dies, multiple processor circuits on a single die, multiple cores of a single processor circuit, multiple threads of a single processor circuit, or a combination of the above. The term shared memory circuit encompasses a single memory circuit that stores some or all code from multiple modules. The term group memory circuit encompasses a memory circuit that, in combination with additional memories, stores some or all code from one or more modules.

The term memory circuit is a subset of the term computer-readable medium. The term computer-readable medium, as used herein, does not encompass transitory electrical or electromagnetic signals propagating through a medium (such as on a carrier wave); the term computer-readable medium may therefore be considered tangible and non-transitory. Non-limiting examples of a non-transitory, tangible computer-readable medium are nonvolatile memory circuits (such as a flash memory circuit, an erasable programmable read-only memory circuit, or a mask read-only memory circuit), volatile memory circuits (such as a static random access memory circuit or a dynamic random access memory circuit), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks, flowchart components, and other elements described above serve as software specifications, which can be translated into the computer programs by the routine work of a skilled technician or programmer.

The computer programs include processor-executable instructions that are stored on at least one non-transitory, tangible computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

What is claimed is:

1. A battery system comprising:

a pressure sensor configured to sense pressure changes corresponding to thickness changes of at least one of a plurality of battery cells of a battery; and a battery management module including a state of charge (SOC) estimator configured to:

estimate the SOC of the battery;

based on the sensed pressure changes, detect at least one of a first inflection point and a second inflection point during one of charging and discharging of the battery;

determine a polarity change in current to identify a transition between charging and discharging of the battery; and in response to the at least one of the first inflection point and the second inflection point being outside a predetermined period of the polarity change in current calibrate the estimated SOC of the battery based on at least one of a first SOC value and a second SOC value corresponding to the at least one of the first inflection point and the second inflection point, respectively, wherein the SOC estimator does not calibrate the estimated SOC in response to the at least one of the first inflection point and the second inflection point being within the predetermined period of the polarity change in current, and wherein the battery management module is configured to calculate capacity retention of the battery and to adjust the at least one of the first SOC value and the second SOC value based on the capacity retention.

2. The battery system of claim 1, further comprising the battery including the plurality of battery cells, wherein the plurality of battery cells include cathode electrodes including LFP cathode active material.

3. The battery system of claim 1, further comprising the battery including the plurality of battery cells, wherein the plurality of battery cells include anode electrodes including graphite anode active material.

4. The battery system of claim 1, further comprising the battery including the plurality of battery cells, wherein the plurality of battery cells of the battery comprise capacitor assisted battery (CAB) cells.

5. The battery system of claim 1, wherein the pressure sensor is arranged between at least two adjacent ones of the plurality of battery cells.

6. The battery system of claim 1, wherein the pressure sensor comprises a 2D pressure sensor.

7. The battery system of claim 1, wherein the SOC estimator is configured to calibrate the estimated SOC of the battery based on the first SOC value and the second SOC value.

8. The battery system of claim 1, wherein the SOC estimator is configured to:

based on the sensed pressure changes, detect a third inflection point and a fourth inflection point during the other of charging and discharging of the battery; and calibrate the estimated SOC of the battery based on a third SOC value and a fourth SOC value corresponding to the third inflection point and the fourth inflection point, respectively.

9. The battery system of claim 1, further comprising the battery including the plurality of battery cells arranged in an enclosure.

10. The battery system of claim 9, wherein the pressure sensor is arranged outside the enclosure.

11. The battery system of claim 1, further comprising the battery including the plurality of battery cells arranged in at least two enclosures.

12. The battery system of claim 11, wherein the pressure sensor is arranged between the two enclosures.

13. A method for estimating state of charge (SOC) of a battery system comprising:

sensing pressure changes corresponding to thickness changes of at least one of a plurality of battery cells;

estimating the SOC of a battery;

based on the sensed pressure changes, detecting at least one of a first inflection point and a second inflection point during one of charging and discharging of the battery;

determining a polarity change in current to identify a transition between charging and discharging of the battery, in response to the at least one of the first inflection point and the second inflection point being outside a predetermined period of the polarity change in current, calibrating the estimated SOC of the battery based on at least one of a first SOC value and a second SOC value corresponding to the at least one of the first inflection point and the second inflection point, respectively, wherein the estimated SOC is not calibrated in response to the at least one of the first inflection point and the second inflection point being within the predetermined period of the polarity change in current; and calculating capacity retention of the battery and adjusting at least one of the first SOC value and the second SOC value based on the capacity retention.

14. The method of claim 13, wherein the plurality of battery cells include cathode electrodes including LFP cathode active material.

15. The method of claim 13, wherein the plurality of battery cells include anode electrodes including graphite anode active material.

16. The method of claim 13, wherein the plurality of battery cells of the battery comprise capacitor assisted battery (CAB) cells.

17. The method of claim 13, further comprising arranging a pressure sensor between at least two adjacent ones of the plurality of battery cells.

18. The method of claim 17, wherein the pressure sensor comprises a 2D pressure sensor.

19. The method of claim 13, further comprising calibrating the estimated SOC of the battery based on the first SOC value and the second SOC value.

20. The method of claim 13, further comprising:

based on the sensed pressure changes, detecting a third inflection point and a fourth inflection point during the other of charging and discharging of the battery; and calibrating the estimated SOC of the battery based on a third SOC value and a fourth SOC value corresponding to the third inflection point and the fourth inflection point, respectively.

* * * * *